US012796449B2

(12) United States Patent
Streb et al.

(10) Patent No.: US 12,796,449 B2
(45) Date of Patent: Nov. 10, 2026

(54) POWER SEMICONDUCTOR DEVICE AND MANUFACTURING METHOD

(71) Applicant: Infineon Technologies AG, Neubiberg (DE)

(72) Inventors: Fabian Streb, Regensburg (DE); Anton Mauder, Kolbermoor (DE); Stephan Pindl, Ergoldsbach (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 108 days.

(21) Appl. No.: 16/937,644

(22) Filed: Jul. 24, 2020

(65) Prior Publication Data

US 2021/0028119 A1 Jan. 28, 2021

(30) Foreign Application Priority Data

Jul. 24, 2019 (DE) ............................ 102019120017

(51) Int. Cl.
*H01L 23/532* (2006.01)
*H01L 23/00* (2006.01)
(Continued)

(52) U.S. Cl.
CPC ....... *H10W 20/4403* (2026.01); *H10W 40/73* (2026.01); *H10W 72/30* (2026.01); *H10W 72/07331* (2026.01)

(58) Field of Classification Search
CPC ........... H10W 72/30; H10W 72/07331; H10W 72/01953; H10W 72/07336; H10W 72/07354; H10W 72/07355; H10W 72/322; H10W 72/325; H10W 72/347; H10W 72/351; H10W 72/352; H10W 72/381; H10W 72/59; H10W 72/923; H10W 72/925; H10W 72/931; H10W 72/952;
(Continued)

(56) References Cited

U.S. PATENT DOCUMENTS

2009/0166893 A1* 7/2009 Okumura ................ H01L 24/33 257/784
2010/0123115 A1* 5/2010 Farnworth ........... H05K 3/3436 257/E23.141
(Continued)

FOREIGN PATENT DOCUMENTS

CN 1667819 A 9/2005
CN 104241513 A 12/2014
(Continued)

*Primary Examiner* — Leonard Chang
*Assistant Examiner* — Stanetta D Isaac
(74) *Attorney, Agent, or Firm* — Murphy, Bilak & Homiller, PLLC

(57) ABSTRACT

A power semiconductor device is proposed. The power semiconductor device includes a semiconductor substrate. The power semiconductor device further includes an electrically conducting first layer. At least part of the electrically conducting first layer includes pores. The power semiconductor device further includes an electrically conducting second layer. The electrically conducting second layer is arranged between the semiconductor substrate and the electrically conducting first layer. The pores are at least partially filled with a phase change material.

10 Claims, 3 Drawing Sheets

(51) Int. Cl.

| | |
|---|---|
| ***H01L 23/427*** | (2006.01) |
| ***H10W 20/44*** | (2026.01) |
| ***H10W 40/73*** | (2026.01) |
| ***H10W 72/00*** | (2026.01) |
| ***H10W 72/30*** | (2026.01) |

(58) Field of Classification Search

CPC . H10W 72/953; H10W 40/73; H10W 40/257; H10W 40/25; H10W 90/734; H10W 90/736

See application file for complete search history.

(56) References Cited

U.S. PATENT DOCUMENTS

| | | | | |
|---|---|---|---|---|
| 2014/0217576 | A1 | 8/2014 | Im et al. | |
| 2014/0319681 | A1 | 10/2014 | Maohua et al. | |
| 2016/0013117 | A1* | 1/2016 | Woehlert | H01L 23/53209 438/642 |
| 2018/0005917 | A1* | 1/2018 | Tang | H01L 23/49811 |
| 2020/0187392 | A1* | 6/2020 | Joshi | H01L 23/3736 |
| 2020/0235032 | A1* | 7/2020 | Joshi | C23C 28/027 |
| 2022/0102299 | A1* | 3/2022 | Lis | H01L 24/40 |

FOREIGN PATENT DOCUMENTS

| | | | |
|---|---|---|---|
| CN | 105261600 | B | 10/2018 |
| DE | 102010062914 | A1 | 6/2012 |
| DE | 102014109489 | A1 | 1/2016 |
| DE | 102016213140 | A1 | 1/2018 |
| DE | 102016122972 | A1 | 5/2018 |
| DE | 102017122053 | A1 | 3/2019 |
| KR | 20140053629 | A | 5/2014 |

* cited by examiner

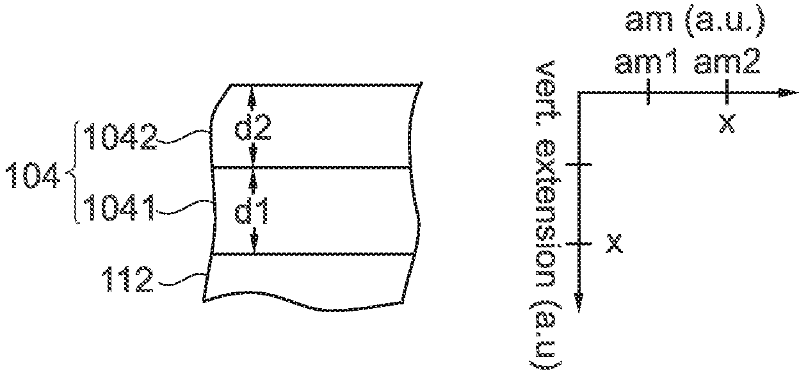
Fig. 2
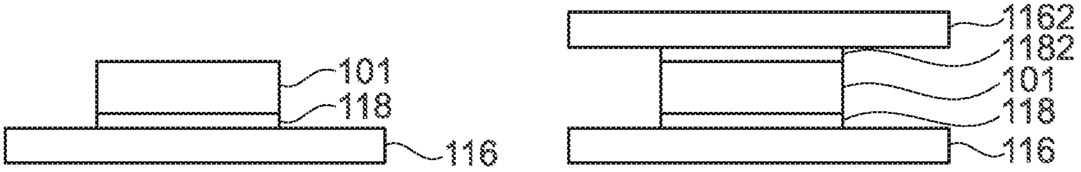
Fig. 3A
Fig. 3B

POWER SEMICONDUCTOR DEVICE AND MANUFACTURING METHOD

TECHNICAL FIELD

Examples of the present disclosure relate to a power semiconductor device and a method of manufacturing a power semiconductor device, wherein the power semiconductor device includes a phase change material.

BACKGROUND

Power semiconductor devices, e.g. insulated gate field effect transistors (IGFETs) such as metal oxide semiconductor field effect transistors (MOSrETs) or insulated gate bipolar transistors (IGBTs) are subject to thermal stress that may be caused by a variety of operating conditions, e.g. by high load currents or by dissipation of switching losses, for example. Improving thermal conductivity and/or thermal capacity of power semiconductor devices is desirable for avoiding a deterioration of device reliability due to excessive thermal stress.

There may be a desire for improved concepts for power semiconductor devices and manufacturing methods therefor.

SUMMARY

An example of the present disclosure relates to a power semiconductor device. The power semiconductor device includes a semiconductor substrate. The power semiconductor device further includes an electrically conducting first layer. At least part of the electrically conducting first layer comprises pores. The power semiconductor device further includes an electrically conducting second layer. The electrically conducting second layer is arranged between the semiconductor substrate and the electrically conducting first layer. The pores are at least partially filled with a phase change material.

Another example of the present disclosure relates to another power semiconductor device. The power semiconductor device includes a semiconductor chip and a carrier. The semiconductor chip and the carrier are joined together by a joining material. The joining material comprises a phase change material.

Another example of the present disclosure relates to another power semiconductor device. The power semiconductor device includes a semiconductor chip. The power semiconductor device further includes a first carrier. The semiconductor chip and the first carrier are joined together at a first side of the semiconductor chip. The semiconductor power device further includes a second carrier. The semiconductor chip and the second carrier are connected by a conducting spacer arranged between a second side of the semiconductor chip and the second carrier. The conducting spacer comprises a phase change material.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the examples and are incorporated in and constitute a part of this specification. The drawings illustrate examples of a power semiconductor device and of methods of manufacturing a power semiconductor device and together with the description serve to explain principles of the examples. Further examples are described in the following detailed description and the claims.

FIG. 2 is a partial sectional view for illustrating an electrically conducting layer having different amounts of phase change material in first and second portions of the electrically conducting layer.

FIGS. 3A and 3B are partial sectional views for illustrating exemplary power semiconductor devices including a phase change material in a joining material arranged between a carrier and a semiconductor chip.

DETAILED DESCRIPTION

Figure 1A:
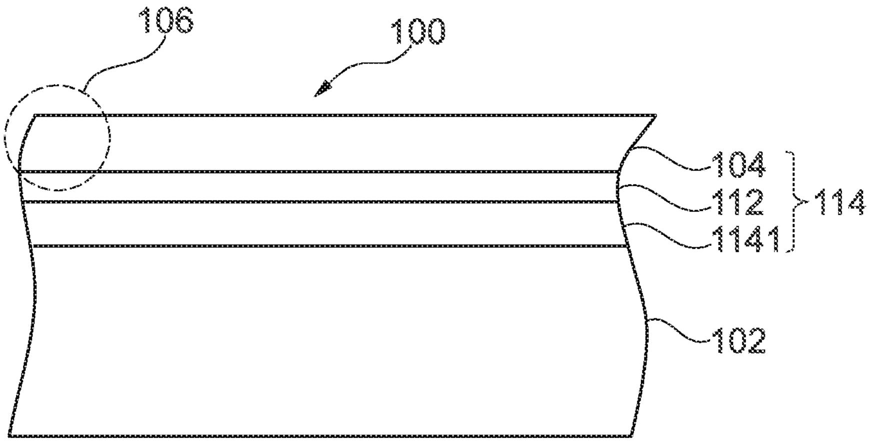
FIG. 1A is a partial sectional view for illustrating an exemplary power semiconductor device including a phase change material in pores of an electrically conducting layer.

In the following detailed description, reference is made to the accompanying drawings, which form a part hereof and in which are shown by way of illustrations specific embodiments in which a power semiconductor device and a method of manufacturing a power semiconductor device may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

Ranges given for physical dimensions include the boundary values. For example, a range for a parameter y from a to b reads as $a \leq y \leq b$. The same holds for ranges with one boundary value like "at most" and "at least".

Main constituents of a layer or a structure from a chemical compound or alloy are such elements which atoms form the chemical compound or alloy. For example, silicon (Si) and carbon (C) are the main constituents of a silicon carbide (SiC) layer.

The term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

According to an example a power semiconductor device may include a semiconductor substrate. The power semiconductor device may further include an electrically conducting first layer. At least part of the electrically conducting first layer may include pores. The power semiconductor device may further include an electrically conducting second layer. The electrically conducting second layer may be arranged between the semiconductor substrate and the electrically conducting first layer. The pores may at least partially be filled with a phase change material.

For example, the power semiconductor device may be a semiconductor diode, or an insulated gate bipolar transistor (IGBT), or an insulated gate bipolar transistors (IGBT), or an insulated gate field effect transistor (IGFET) such as a metal oxide semiconductor field effect transistor (MOSFET), or a thyristor or silicon controlled rectifier. The power semiconductor device may be a semiconductor device configured to block high voltages and/or conduct or switch high currents, e.g. currents greater than 100 mA, or greater than 1 A, or even greater than 10 A or 100 A. A power semiconductor device is thus different from e.g. a transistor in a memory circuit block or digital circuit block, for example. The power semiconductor device may include a plurality, e.g. tens, hundreds or even thousands of transistor cells connected in parallel, for example. The power semiconductor device may have a breakdown voltage or blocking voltage of more than 100 V (e.g. a breakdown voltage of 200 V, 300 V, 400 V or 500 V) or more than 500 V (e.g. a breakdown voltage of 600 V, 700 V, 800 V or 1000 V) or more than 1000 V (e.g. a breakdown voltage of 1200 V, 1500 V, 1700V, 2000V, 3300V or 6500V), for example. An active surface area of the power semiconductor device, e.g. an active surface area of the transistor cells of a power semiconductor transistor or the active surface area of an anode region of a power semiconductor diode, may range from 1 $mm^2$ to 10 $cm^2$, or from 2 mm: to 2 $cm^2$, for example. In some examples, the power semiconductor device is a vertical power semiconductor device where a load current is directed along a vertical direction between opposite first and second surfaces of the semiconductor substrate. This may imply a source or anode electrode electrically connected to the first surface of the semiconductor body and a drain or cathode electrode electrically connected to the second surface of the semiconductor substrate, for example.

The semiconductor substrate may formed by a single crystalline semiconductor material, for example silicon (Si), silicon carbide (SiC), germanium (Ge), a silicon germanium crystal (SiGe), gallium nitride (GaN) or gallium arsenide (GaAs) by way of example.

For example, the phase change material (PCM) may exhibit a solid-solid-phase change at a phase transition temperature Tc between 150° C. and 400° C. or between 200 and 300° C. For example, the PCM is crystalline below the phase transition temperature Tc and is amorphous above the phase transition temperature Tc. The lower value for the phase transition temperature Tc may defined by the maximum allowed temperature of the device in normal operation (maximum junction temperature TJ of e.g. 150*0, 175° C. or even 200° C.). The upper possible value for the phase transition temperature Tc may be given by the lower temperature where the semiconductor device or its interface to outer electrical or thermal contacts may be damaged (e.g. melting point of a solder joint, thermal runaway of the semiconductor device or the like). The PCM may be selected to have its phase transition temperature within this temperature range to be not activated in normal allowed device operation and to protect the semiconductor device in abnormal operation points. For example, the PCM may be disposed in crystalline form locally or large-area in the pores in regions of the power semiconductor device carrying high current densities and high thermal loads during operation. Such regions may be regions of high thermal load during switching or regions of high electric fields, e.g. source regions or emitter regions or edge regions of power IGBTs, power diodes, power-FETs, regions of early avalanche breakdown or latch-up, e.g. regions including break-over diodes which result in locally and well-reduced breakdown voltage of the device, deep trenches, and regions including amplifying gate structures of thyristors. During a short and intensive current pulse in these regions, the PCM exhibits a solid-solid phase transition at the phase change temperature Tc within a short time period, e.g. within a typical period between 50 ns to 200 ns and absorbs latent heat while remaining at the phase change temperature Tc. In other words, the PCM may act as a heat sink and heat can effectively be dissipated by the PCM. This behavior counteracts occurrence of high temperatures in regions of the power semiconductor device 100 in which the PCM is disposed and therefore counteracts hot spot generation and thermal damage in these regions of the power semiconductor device. The further away the PCM is located from the point of heat generation (e.g. device junction of the semiconductor device) the lower the value for the phase transition temperature may be chosen. For example, locating or embedding the PCM in the metallization of the semiconductor device may lead to selection of a material with higher phase transition temperature Tc compared to embedding the PCM in a solder layer or package element further away since heat transfer from the semiconductor device to the PCM will require a certain temperature difference due to thermal resistances on the way.

The phase transition temperature Tc and the latent heat that is absorbed by the PCM may be adjusted by selecting the PCM or a combination of phase change materials accordingly. An amount of latent heat absorbed by the PCM may be adjusted by dimensions of PCM that is present locally. A thickness of the PCM may be adjusted with respect to an optimal combination of latent heat, local heat dissipation, and electrical conductivity.

There exist a broad range of PCMs, e.g. salt hydrates (e.g. $MnH_2O$), organic PCMs (e.g. $C_nH_{2n+2}$), and eutectic compounds of PCMs that have characteristic phase transition temperatures Tc and latent heats. According to one example, the PCM includes a chalcogenide, e.g. GeSbTe (Germanium-Antimony-Tellurium or GST). For example, the PCM may be an organic PCM undergoing a phase change between solid and liquid, e.g. paraffin, fatty acids. For example, the PCM may also be an inorganic PCM undergoing a phase change between solid and liquid, e.g. solders, eutectic metals or salt hydrates. For example, the PCM may also be an organic PCM undergoing a phase change between solid and solid, e.g. alcohols. For example, the PCM may also be an organometallic PCM undergoing a phase change between solid and solid. For example, the PCM may also be an inorganic PCM undergoing a phase change between solid and solid. For example, the PCM may also be a polymeric PCM undergoing a phase change between solid and solid, e.g. cis-trans or crystalline-amorphic. The PCM may be chosen depending on enthalpy and temperature ranges, for example.

The PCM, e.g. GeSbTe, may be doped with one or a combination of carbon (C), nitrogen (N), oxygen (O), or indium (In) for adjusting the phase transition temperature Tc. A dopant concentration of C and N ranges typically between 2% and 10% and the phase transition temperature Tc tends to increase with increasing dopant concentration. Thereby, the phase transition temperature may be adjusted between 200° C. and 300° C., for example.

A short current pulse of high amplitude as caused by e.g. a short circuit or by a cosmic radiation event can affect the phase change from the crystalline to the amorphous phase. A resistivity of the PCM in the amorphous phase may be considerably higher than in the crystalline phase. Thus, the phase change may cause a voltage drop due to increase of resistivity that counteracts the formation of current filaments and may result in decomposition of current filaments. The resistivity of the PCM may range between $10^{-4}$ Ohm cm to $10^{-2}$ Ohm cm in the crystalline phase, i.e. is low-ohmic and may range between 1 Ohm cm to $10^{3}$ Ohm cm in the amorphous phase, for example.

The phase change of the PCM may be reversible and amorphous parts of the PCM may be converted into crystalline form by an appropriate process, e.g. by annealing. Annealing may be achieved by a moderate current applied over an extended time period that heats the amorphous material over the crystallization temperature and keeps the amorphous material at this temperature until nucleation begins and the material starts recrystallization. Annealing may be carried out during normal operation of the power semiconductor device.

For example, the phase transition of the phase change material may be from a solid phase below Tc to a liquid phase above Tc.

For example, the phase change material may include a metal or a metal compound. By way of example, the phase change material may include at least, one of tin (Sn), bismuth (Bi), zinc (Zn), indium (In). Further embodiments include other metals or non-metals such as dielectrics exhibiting a phase change by absorption of energy in a temperature range between 150° C. and 400° C.

For example, the pores may be any kind of cavity within a volume of the electrically conducting first layer.

For example, the pores may comprise voids. For example, the pores may comprise at least one of open pores, closed pores, or a combination of open pores and closed pores.

For example, the electrically conducting second layer may comprise a non-porous metal or non-porous metal alloy. This may allow for preventing or suppressing diffusion of PCM material from the pores of the electrically conducting first layer to an active area in the semiconductor substrate, for example. A non-porous metal may be a metal that may only include unintentional pores, e.g. pores that are introduced unintentionally by process technology, but not pores that have been introduced intentionally, e.g. by respective processes for forming pores.

For example, each of the electrically conducting first and second layers may include one or more of aluminum (Al), copper (Cu), alloys of aluminum or copper, for example AlSi, AlCu or AlSiCu, nickel (Ni), titanium (Ti), titanium nitride (TIN), Tungsten-titanium (Tiff), tungsten (W), tantalum (Ta), tantalum nitride (TaN), silver (Ag), gold (Au), platinum (Pt), palladium (Pd), nickel silicide (NiSi), for example. For example, the electrically conducting first layer may be a Cu layer including the pores and the electrically conducting second layer may be a Cu layer that is free of pores, e.g. does not include any pores. One or more further electrically conducting layers, e.g. contact mediation and/or adhesion layers, may be arranged between the second electrically conducting layer and the semiconductor substrate, e.g. Al containing layer(s).

For example, a part of the electrically conducting first layer may be subdivided into a first portion and a second portion. The first portion of the electrically conducting first layer is located closer to the semiconductor substrate than the second portion of the electrically conducting first layer. An amount of the phase change material in the second portion is larger than in the first portion. For example, a distribution of an amount of the phase change material along a vertical direction, e.g. perpendicular to a surface of the semiconductor substrate, may depend on a diffusion process of phase change material from a joining material including the phase change material and a density of the pores, for example. A vertical extent, e.g. thickness, of the first portion may correspond to the vertical extent of the second portion. The amount of the phase change material may be a mass per unit surface area averaged along a vertical extent of the respective portion, for example.

For example, the electrically conducting first layer may be an outermost layer of a wiring portion of the semiconductor substrate. The wiring portion may include one or more wiring levels, e.g. patterned metallization layers, and interlayer dielectrics arranged between the wiring levels. The wiring levels may be electrically interconnected by contact vias extending through openings in the interlayer dielectrics, for example. For example, the electrically conducting first layer may nave a thickness, e.g. vertical extent, in a range from 3 μm to 20 μm, or from 5 μm to 10 μm.

According to an example the power semiconductor device may further include a carrier and a semiconductor chip comprising the semiconductor substrate. The semiconductor chip and the carrier may be joined together by a joining material. The joining material may comprise the phase change material. The joining material may be arranged between an outermost metallization layer of a wiring portion of the semiconductor chip, e.g. a power metallization layer, and the carrier, e.g. a direct copper bonded (DCB) or direct bonded copper (DBC) substrate or lead frame.

According to another example a power semiconductor device may include a semiconductor chip. The power semiconductor device may further include a carrier. The semiconductor chip and the carrier may be joined together by a joining material. The joining material may comprise a phase change material. For example, the joining material may include at least one of a soldering material and a sintering material. For example, the phase change material may be integrated into a silver sintering paste. For example, a thickness of the silver sintering paste may range from 5 μm to 50 μm, or from 10 μm to 30 μm. The phase change material may be integrated as particles and/or layer (s). The phase change material may hinder excessive heating in the power semiconductor device by energy dissipation due to the phase change. This may allow for counteracting formation of hot spots that may be caused by current filaments, for example. For example, a matrix of a silver sintering paste may direct thermal energy to the phase change material integrated into the silver sinter paste while ensuring mechanical stability. The silver paste may include micro- and/or nano-crystallites, for example.

According to another example a power semiconductor device may include a semiconductor chip. The power semiconductor device may further include a first carrier. The semiconductor chip and the first carrier may be joined together at a first side of the semiconductor chip. The power semiconductor device may further include a second carrier. The semiconductor chip and the second carrier may be connected, e.g. thermally connected and, in addition, optionally electrically connected, by a conducting spacer arranged between a second side of the semiconductor chip and the second carrier. The conducting spacer may include a phase change material.

For example, at least one of the first and second carriers may be a direct copper bonded, DCB carrier.

For example, a vertical extent of the conducting spacer may range from 10 μm to 10 mm or may range from 100 μm to 2 mm. The vertical extent of the conducting spacer may be larger than the vertical extent of the semiconductor chip, for example. A joining material, e.g. a soldering and/or sintering material, may be arranged between the conducting spacer and the semiconductor chip. For example, the joining material may directly adjoin the conducting spacer and an outermost metallization layer of a wiring portion of the semiconductor chip, e.g. a power metallization layer.

For example, at least part of the conducting spacer may include pores. The pores may be partially filled with the phase change material. For example, the pores may comprise voids. For example, the pores may comprise at least one of open pores, closed pores, or a combination of open pores and closed pores.

For example, the conducting spacer may include through holes. The through holes may be partially filled with the phase change material. For example, the conducting spacer may have a continuous shape, e.g. a honeycomb structure. A degree of filling the pores or through holes with phase change material may depend on a volume change at the phase change temperature of the phase change material, for example.

For example, a phase change temperature of the phase change material may be in a range from 150° C. to 400° C., and the phase change at the phase change temperature may occur from solid to solid or from solid to liquid by absorption of energy.

For example, the phase change material may include at least one of a chalcogenide, a salt and an organic phase change material.

Manufacturing the power semiconductor device according to any of the examples above may include, inter alia, forming the electrically conducting first layer by thermal spraying. Thermal spraying may be used to manufacture a copper metallization including pores. The pores in a copper matrix may be at least partially filled with the phase change material. By deoxidizing the copper surface/e.g. by forming gas or formic acid, wetting of the copper surface may be improved, for example.

Manufacturing the power semiconductor device according to any of the examples above may further include, inter alia, forming the joining material as a mixture of at least a soldering or sintering material and the phase change material. The phase change material can be second soldering material different from the soldering or sintering material and the second soldering material having a lower melting temperature compare to the soldering or sintering material.

For example, the pores may be at least partially filled with the phase change material when joining the semiconductor substrate or chip and the carrier via the electrically conducting first layer. For example, phase change material integrated in the joining material, e.g. a soldering material or a sintering material such as a silver sintering paste, may diffuse from the joining material into pores of an outer or outermost metallization layer of a wiring portion of a power semiconductor chip, for example.

The examples and features described above and below may be combined.

More details and aspects are mentioned in connection with the examples described above or below. Processing the power semiconductor device may comprise one or more optional additional features corresponding to one or more aspects mentioned in connection with the proposed concept or one or more examples described above or below.

The aspects and features mentioned and described together with one or more of the previously described examples and figures, may as well be combined with one or more of the other examples in order to replace a like feature of the other example or in order to additionally introduce the feature to the other example.

The description and drawings merely illustrate the principles of the disclosure. Furthermore, all examples recited herein are principally intended expressly to be only for illustrative purposes to aid the reader in understanding the principles of the disclosure and the concepts contributed by the inventor (s) to furthering the art. All statements herein reciting principles, aspects, and examples of the disclosure, as well as specific examples thereof, are intended to encompass equivalents thereof.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

FIG. 1A illustrates a partial sectional view of a power semiconductor device 100.

The power semiconductor device 100 includes a semiconductor substrate 102. For example, the semiconductor substrate 100 may be a Si substrate, a GaN substrate, a SiC substrate, a GaAs substrate, another type of III-V or II-VI substrate, etc.

Figure 1B:
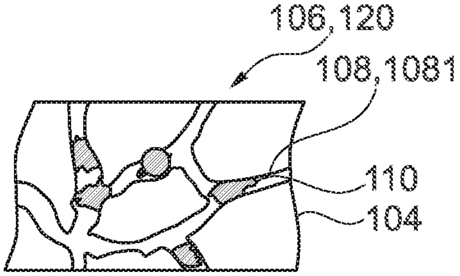
FIGS. 1B to 1D illustrate exemplary shapes of the pores that are at least partly filled with the phase change material.
Figure 1C:
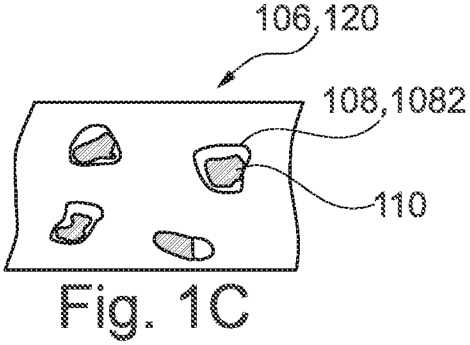
Figure 1D:
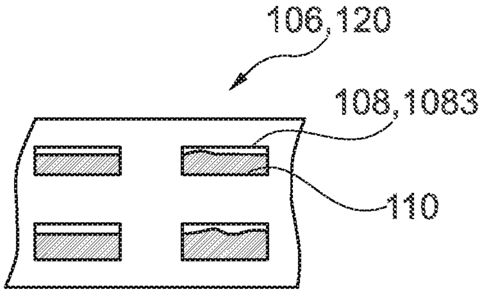

The power semiconductor device 100 includes an electrically conducting first layer 104. At least a part 106 of the electrically conducting first layer 104 includes pores 108. Pores 108 may be seen either as voids in the surround material matrix of at least the part 106 of the electrically conducting first layer 104 or may be formed by particles forming at least the part 106 of the electrically conducting first layer 104. Referring to the schematic view of FIG. 1B, the pores 108 in the part 106 are exemplified as open pores 1081 that are at least partially filled with a phase change material 110. Referring to the schematic view of FIG. 1C, the pores 108 in the part 106 are exemplified as closed pores 1082 that are at least partially filled with the phase change material 110. The phase change material 110 may also be arranged in a combination of open and closed pores 108, for example. Referring to the schematic view of FIG. 1D, the pores 108 in the part 106 are exemplified as regularly arranged voids 1083 that are at least partially filled with the phase change material 110. For example, the regularly arranged voids 1083 may be realized by using conventional patterning technologies in semiconductor production like lithography and etching. The phase change material 110 may also be arranged in any combination of open and closed pores and voids 108, for example.

Still referring to FIG. 1A, the power semiconductor device 100 further includes an electrically conducting second layer 112. The electrically conducting second layer 112 is arranged between the semiconductor substrate 102 and the electrically conducting first layer 104.

The electrically conducting first and second layers 104, 112 may be part of a wiring portion 114 on the semiconductor substrate 102. Optionally, the wiring portion 114 may include a wiring part 1141 arranged between the semiconductor substrate 102 and the electrically conducting second layer 112. The wiring part may include one or more wiring levels, e.g. patterned metallization layers and interlayer dielectrics arranged between the semiconductor substrate 102 and a lowermost metallization layer or between metallization layers of different wiring levels. The wiring part may further include vias for electrically connecting active device areas of the semiconductor substrate 102 to the wiring levels of the wiring portion 114. For power semiconductor diodes, the electrically conducting first layer 104 may be an anode or cathode electrode, for example. For power MOSFETs, the electrically conducting first layer 104 may be a source or drain electrode, for example. For power IGBTs, the electrically conducting first layer 104 may be an emitter or collector electrode, for example.

In some examples the electrically conducting first layer 104 is a power metallization layer and the electrically conducting second layer 112 is a barrier layer. For example, the power metallization layer may comprise Cu and the barrier layer 104 may comprise at least one of Ti, TiW, W and Ta. In another example, the power metallization layer comprises Al or an Al alloy and the barrier layer 104 comprises at least one of Ti, TiN and W. In yet another example, the power metallization layer comprises Au and the barrier layer is compatible with Au. A common barrier layer for at least Cu and Al metal systems is TiW, for example. Still other power metallization layer/barrier layer combinations are possible. The barrier layer may be configured to prevent diffusion of metal atoms and/or phase change material from the power metallization layer in a direction toward the semiconductor substrate 102. For example, in the case of Cu metallization, the barrier layer may comprise TiW or any other suitable metal layer or stack of metal sublayers configured to prevent diffusion of Cu atoms from the power metallization structure in a direction toward the semiconductor substrate 102.

Further details described in the examples above likewise apply to the example illustrated in FIGS. 1A to 1D.

FIG. 2 illustrates a partial sectional view of another example of a power semiconductor device 100. A part of the electrically conducting first layer 104 is subdivided into a first portion 1041 and a second portion 1042. A first vertical extension d1 of the first portion 1041 may correspond to a second vertical extension d2 of the second portion 1042. The first portion 1041 is located closer to the semiconductor substrate 102 than the second portion 1042. As is illustrated in the schematic graph of FIG. 2, an amount am2 of the phase change material, e.g. a mass of the phase change material per unit area, averaged along the second vertical extension d2 in the second portion 1042 is larger than an amount am1 of the phase change material, e.g. a mass of the phase change material per unit area, averaged along the first vertical extension d1 in the first portion 1041.

Further details described in the examples above may likewise apply to the example illustrated in FIG. 2.

FIG. 3A illustrates a partial sectional view of another power semiconductor device 100.

The power semiconductor device 100 includes a semiconductor chip 101. The power semiconductor device further includes a carrier 116, e.g. a lead frame or DCB substrate. The semiconductor chip 101 and the carrier 116 are joined together by a joining material 118. The joining material includes a phase change material. For example, the joining material 118 may include at least one of a soldering material and a sintering material. For example, the phase change material may be integrated into a silver sintering paste. The phase change material may be integrated as particles and/or layer(s). A vertical extension of the joining material 118 may range from 100 μm to several mm, for example.

As is illustrated in the partial sectional view of another power semiconductor device 100 in FIG. 3B, the semiconductor chip 101 may also be joined together with a second carrier 1162 by a second joining material 1182 at a side opposite to the carrier 116. The second joining material 1182 may also include a phase change material. Apart from the semiconductor chip 101, further semiconductor chips may be arranged on the carrier 116, for example. For example, the second carrier 1162 may be a lead frame, or DCB substrate, or a metal band, or a clip. The second carrier 1162 may be encapsulated by mold or may be arranged in a module, for example. The second carrier 1162 may allow for an improved cooling of the semiconductor chip 101, e.g. for top side cooling. In some embodiments, the second carrier 1162 may also be electrically conductive and be part of a current path between load terminals of the semiconductor chip 101, for example.

Further details described in the examples above likewise apply to the examples illustrated in FIGS. 3A and 3B.

Figure 4:
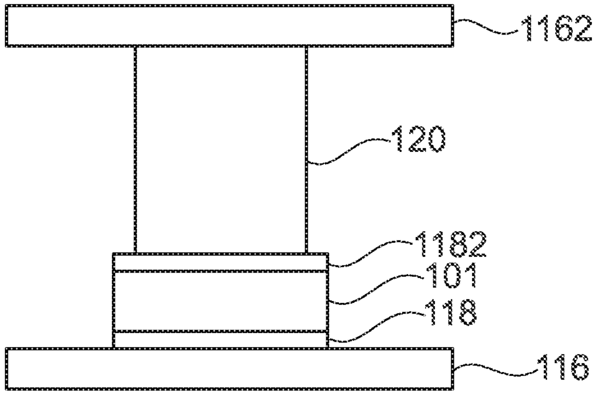
FIG. 4 is a partial sectional view for illustrating an exemplary power semiconductor device including a phase change material in a conducting spacer arranged between a carrier and a semiconductor chip.

FIG. 4 illustrates a partial sectional view of another example of a power semiconductor device 100. The power semiconductor device 100 includes a semiconductor chip 101. The power semiconductor device further includes a carrier 116. The semiconductor chip 101 and the carrier 116 are joined together at a first side of the semiconductor chip 101 via the joining material 116. The power semiconductor device 100 further includes the second carrier 1162. The semiconductor chip 101 and the second carrier 1162 are connected by a conducting spacer 120 arranged between a second side of the semiconductor chip 101 and the second carrier 1162. The conducting spacer 120 may be configured to conduct heat e.g. be thermally conducting. In addition, the conducting spacer 120 may also be electrically conducting, e.g. when being part of a current path between load terminals of the semiconductor chip 101. In some embodiments, the conducting spacer 120 is electrically separated from an electric potential at a front side of the semiconductor chip 101, e.g. a source potential. In this case the conducting spacer may be used to conduct heat from the chip to a heat sink, for example. In some embodiments, an arrangement of the conducting spacer 120 and the second carrier 1162 may also be reversed with respect to the vertical direction, e.g. the second carrier 1062 may be closer to the semiconductor chip 101 than the conducting spacer 120. A second joining material 1182 may be arranged between the conducting spacer 120 and the semiconductor chip 101. The conducting spacer 120 comprises a phase change material. Similar to the examples described above for the electrically conducting first layer 104, at least part of the conducting spacer 120 may include pores 108 (see e.g. FIGS. 1B to 1D) that are at least partially filled with the phase change material 110. For example, the conducting spacer 120 may include one or more of aluminum (Al), copper (Cu), alloys of aluminum or copper, for example AlSi, AlCu or AlSiCu, nickel (Ni), titanium (Ti), tungsten (W), tantalum (Ta), silver (Ag), gold (Au), platinum (Pt), palladium (Pd), for example.

Figure 5A:
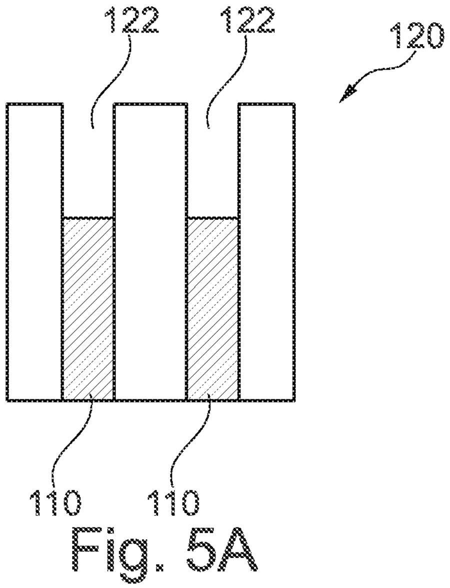
FIG. 5A is a partial sectional view and FIG. 5B is a partial top view for illustrating an exemplary conducting spacer including through holes at least partially filled with phase change material.
Figure 5B:
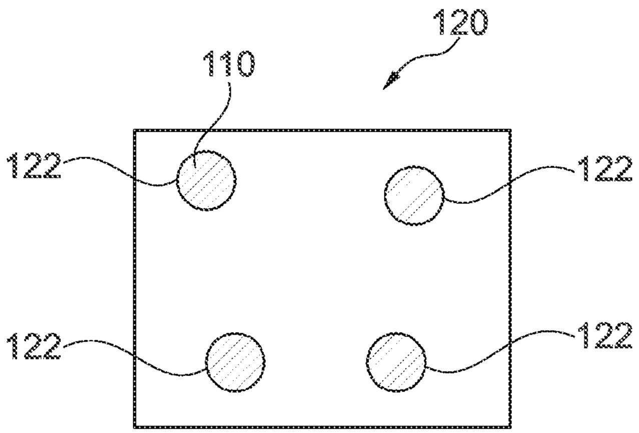

In the exemplary view of the conducting spacer 120 illustrated in FIGS. 5A and 5B, the conducting spacer 120 comprises through holes 122, wherein the through holes 122 are at least partially filled with the phase change material 110. The through holes 122 are exemplified by pillars. Other shapes of the through holes, e.g. polyangular shapes or elliptic shapes, may also be used. For example, the conducting spacer 120 may have a honeycomb structure.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor device, comprising:
- a semiconductor substrate;
- a carrier;
- an electrically conducting first layer; and
- an electrically conducting second layer arranged between the semiconductor substrate and the electrically conducting first layer,
- wherein at least part of the electrically conducting first layer comprises pores,
- wherein the pores are at least partially filled with a phase change material,
- wherein the electrically conducting first layer is an outermost layer of a wiring portion of on the semiconductor substrate,
- wherein the power semiconductor device further comprises a semiconductor chip comprising the semiconductor substrate,
- wherein the semiconductor chip and the carrier are joined together by a joining material, and
- wherein the joining material comprises the phase change material.

2. The power semiconductor device of claim 1, wherein the pores comprise voids.

3. The power semiconductor device of claim 1, wherein the pores comprise at least one of open pores, closed pores, or a combination of open pores and closed pores.

4. The power semiconductor device of claim 1, wherein the electrically conducting second layer comprises a non-porous metal or non-porous metal alloy.

5. The power semiconductor device of claim 1, wherein the electrically conducting first layer is a metal or metal alloy layer including at least one of Cu, Al, alloys of aluminum or copper, AlSi, AlCu, AlSiCu, Ni, Ti, TiN, TiW, W, Ta, TaN, Ag, Au, Pt, Pd, NiSi.

6. The power semiconductor device of claim 1, wherein a part of the electrically conducting first layer is subdivided into a first portion and a second portion, wherein the first portion is located closer to the semiconductor substrate than the second portion, and wherein an amount of the phase change material in the second portion is larger than in the first portion.

7. The power semiconductor device of claim 1, wherein the electrically conducting first layer is a power metallization layer.

8. The power semiconductor device of claim 1, wherein the electrically conducting second layer is a barrier layer.

9. The power semiconductor device of claim 1, wherein the electrically conducting first layer is an anode, cathode, source, drain, emitter, or collector electrode.

10. A power semiconductor device, comprising:
- a semiconductor substrate;
- an electrically conducting first layer; and
- an electrically conducting second layer arranged between the semiconductor substrate and the electrically conducting first layer,
- wherein at least part of the electrically conducting first layer comprises pores,
- wherein the pores are at least partially filled with a phase change material,
- wherein the electrically conducting first layer and/or the electrically conducting second layer is part of a wiring portion on the semiconductor substrate,
- wherein the phase change material includes at least one of a chalcogenide, a salt and an organic phase change material.

* * * * *